United States Patent
Yamanaka et al.

(10) Patent No.: US 11,511,311 B2
(45) Date of Patent: Nov. 29, 2022

(54) APPLICATION MECHANISM AND APPLICATION APPARATUS

(71) Applicant: NTN Corporation, Osaka (JP)

(72) Inventors: Akihiro Yamanaka, Iwata (JP); Dongkelong Ai, Iwata (JP); Haruka Nakamura, Iwata (JP)

(73) Assignee: NTN CORPORATION, Osaka (JP)

( * ) Notice: Subject to any disclaimer, the term of this patent is extended or adjusted under 35 U.S.C. 154(b) by 133 days.

(21) Appl. No.: 16/635,519

(22) PCT Filed: Jul. 18, 2018

(86) PCT No.: PCT/JP2018/026914
§ 371 (c)(1),
(2) Date: Jan. 30, 2020

(87) PCT Pub. No.: WO2019/026624
PCT Pub. Date: Feb. 7, 2019

(65) Prior Publication Data
US 2020/0254477 A1    Aug. 13, 2020

(30) Foreign Application Priority Data

Aug. 2, 2017 (JP) .............................. JP2017-149884

(51) Int. Cl.
*B05C 5/02* (2006.01)
*B05C 11/10* (2006.01)
(Continued)

(52) U.S. Cl.
CPC ................ *B05C 13/00* (2013.01); *B05C 1/02* (2013.01); *B05C 5/02* (2013.01); *B05C 5/0225* (2013.01);
(Continued)

(58) Field of Classification Search
CPC combination set(s) only.
See application file for complete search history.

(56) References Cited

U.S. PATENT DOCUMENTS

| 5,186,982 A | * | 2/1993 | Blette | ........................ B05C 1/00 |
| | | | | 118/243 |
| 2002/0100774 A1 | * | 8/2002 | Brooks | ................. B05C 5/0225 |
| | | | | 222/504 |
| 2018/0252512 A1 | * | 9/2018 | Ohba | ........................ B05C 5/02 |

FOREIGN PATENT DOCUMENTS

| CN | 1840356 A | 10/2006 |
| CN | 105813765 A | 7/2016 |

(Continued)

OTHER PUBLICATIONS

International Search Report issued in corresponding International Patent Application No. PCT/JP2018/026914, dated Sep. 25, 2018, with English translation.

Chinese Office Action issued in corresponding Chinese Patent Application No. 201880649958.6, dated Jan. 28, 2021, with partial English translation.

*Primary Examiner* — Binu Thomas
(74) *Attorney, Agent, or Firm* — McDermott Will & Emery LLP

(57) ABSTRACT

An application mechanism according to one embodiment of the present invention serves as an application mechanism that applies an application material onto a substrate using an application needle. The application mechanism according to one embodiment of the present invention includes: a holder base; a slide mechanism attached to an inside of the holder base; an application needle fixing member, to which the application needle is attached, the application needle fixing member being supported by the slide mechanism so as to be slidable in an extending direction of the application needle; and a position holding mechanism that holds a relative (Continued)

position of the application needle fixing member with respect to the slide mechanism.

5 Claims, 3 Drawing Sheets

(51) Int. Cl.
*B05C 13/00* (2006.01)
*B05C 1/02* (2006.01)
(52) U.S. Cl.
CPC .. *B05C 11/1034* (2013.01); *H05K 2203/0126* (2013.01)

(56) References Cited

FOREIGN PATENT DOCUMENTS

| | | | | |
|---|---|---|---|---|
| JP | 2006-276188 A | 10/2006 | | |
| JP | 2006-310266 A | 11/2006 | | |
| JP | 2006310266 A * | 11/2006 | | |
| JP | 2007-268353 A | 10/2007 | | |
| JP | 2008-178775 A | 8/2008 | | |
| JP | 2008-296148 A | 12/2008 | | |
| JP | 2013-109315 A | 6/2013 | | |
| JP | 2015007564 A * | 1/2015 | ............ | B23K 26/00 |
| JP | 2015-112577 A | 6/2015 | | |
| JP | 5989281 B2 | 8/2016 | | |
| WO | 2015/087898 A1 | 6/2015 | | |

\* cited by examiner

APPLICATION MECHANISM AND APPLICATION APPARATUS

CROSS-REFERENCE OF RELATED APPLICATIONS

This application is the U.S. National Phase under 35 U.S.C. § 371 of International Patent Application No. PCT/JP2018/026914, filed on Jul. 18, 2018, which in turn claims the benefit of Japanese Patent Application No. 2017-149884, filed on Aug. 2, 2017, the entire disclosures of which Applications are incorporated by reference herein.

TECHNICAL FIELD

The present invention relates to an application mechanism and an application apparatus. More particularly, the present invention relates to an application mechanism and an application apparatus each for applying an application material onto a substrate.

BACKGROUND ART

As an application mechanism that applies an application material onto a substrate using an application needle, there have conventionally been known application mechanisms disclosed in Japanese Patent Laying-Open No. 2007-268353 (PTL 1), Japanese Patent Laying-Open No. 2013-109315 (PTL 2), and Japanese Patent Laying-Open No. 2015-112577 (PTL 3).

The application mechanism disclosed in PTL 1 includes an application needle, an application-needle fixing plate, an arm, a linear guide member, a support stage, a cylinder, and a pin. The application needle is attached to the application-needle fixing plate. The application-needle fixing plate is attached to the arm. The linear guide member is attached to the support stage and supports the arm so as to be movable in the up-down direction. The cylinder is attached to the support stage and has a drive plate. The pin horizontally extends so as to support the arm and is attached to the drive plate.

The cylinder moves the drive plate downward to thereby prevent the pin from supporting the arm. As a result, the arm moves downward due to its self-weight, so that the application needle comes into contact with the substrate. Thus, according to the application mechanism disclosed in PTL 1, the application material is applied.

The application mechanism disclosed in PTL 2 includes an application needle, an application needle holder, an arm, a slide mechanism, a support pin, a cylinder, a support member, and a contact-pressure reducing mechanism. The application needle is attached to the application needle holder. The application needle holder is attached to the arm. The slide mechanism is attached to the support member and supports the arm so as to be movable in the up-down direction. The pin horizontally extends so as to support the arm. The cylinder is attached to the support member and moves the pin in the up-down direction. When the pin is moved downward to thereby prevent the pin from supporting the arm. As a result, the arm and the application needle that is attached to the arm through the support needle holder move due to their self-weights toward the substrate.

The contact-pressure reducing mechanism serves to couple the arm and the support member. The contact-pressure reducing mechanism is a spring, for example. The contact-pressure reducing mechanism applies force to the arm so as to be raised upward as the application needle approaches the substrate. Thus, according to the application mechanism disclosed in PTL 2, the contact pressure exerted by the application needle upon the substrate is reduced.

The application mechanism disclosed in PTL 3 includes an application needle and an application needle holder. The application needle holder includes a holder base, an application needle fixing member, a linear motion member, and an elastic member. The application needle is attached to the application needle fixing member. The linear motion member is attached to the holder base and supports the application needle fixing member so as to be movable in one direction. The elastic member couples the holder base and the application needle fixing member. The elastic member applies force to the application needle so as to be moved toward the substrate.

CITATION LIST

Patent Literature

PTL 1: Japanese Patent Laying-Open No. 2007-268353
PTL 2: Japanese Patent Laying-Open No. 2013-109315
PTL 3: Japanese Patent Laying-Open No. 2015-112577

SUMMARY OF INVENTION

Technical Problem

In the application mechanism disclosed in PTL 1, when the application needle tip is in contact with the substrate, the weights of the application needle, the application-needle fixing plate and the arm are exerted as self-weights on the application needle tip. In the application mechanism disclosed in PTL 1, in the case where the application needle tip is formed thin in order to apply a minute pattern on a substrate, the pressure between the application needle tip and the substrate may cause a dent in the substrate or damage to the application needle tip.

In the application mechanism disclosed in PTL 2, the contact-pressure reducing mechanism reduces the pressure between the application needle tip and the substrate. However, the effect of reducing the pressure between the application needle tip and the substrate by the contact-pressure reducing mechanism is lessened in accordance with an increase in speed at which the application needle comes into contact with the substrate. As a result, the application mechanism disclosed in PTL 2 may also cause damage to the application needle tip or a dent in the substrate.

In the application mechanism disclosed in PTL 3, when the application needle tip comes into contact with the substrate, only the weights of the application needle and the application needle fixing member are exerted as self-weights. Thus, in the application mechanism disclosed in PTL 3, the pressure between the application needle tip and the substrate is relatively low, thereby suppressing a dent in the substrate and damage to the application needle tip. In PTL 3, however, the elastic member applies force to the application needle so as to be moved toward the substrate. Thus, when the application needle tip contacts the substrate at various height positions, the force applied by the elastic member increases the pressure between the application needle tip and the substrate. Accordingly, the application mechanism disclosed in PTL 3 also has room for improvement in order to prevent damage to the application needle tip and a dent in the substrate.

The present invention has been made in view of the above-described problems of the conventional techniques.

More specifically, the present invention is to provide an application mechanism and an application apparatus, each of which allows suppression of damage to an application needle tip and a dent in a substrate.

Solution to Problem

An application mechanism according to one embodiment of the present invention serves as an application mechanism that applies an application material onto a substrate using an application needle. The application mechanism according to one embodiment of the present invention includes: a holder base; a slide mechanism attached to an inside of the holder base; an application needle fixing member, to which the application needle is attached, the application needle fixing member being supported by the slide mechanism so as to be slidable in an extending direction of the application needle; and a position holding mechanism that holds a relative position of the application needle fixing member with respect to the slide mechanism. The position holding mechanism holds the relative position of the application needle fixing member with respect to the slide mechanism until immediately before contact of a tip of the application needle with the substrate. The position holding mechanism allows the relative position of the application needle fixing member with respect to the slide mechanism to change from immediately before contact of the tip of the application needle with the substrate until separation of the tip of the application needle from the substrate.

In the application mechanism, the position holding mechanism may be constituted of a magnetic member and an electromagnet that is disposed to face the magnetic member.

In the application mechanism, the magnetic member may be a permanent magnet. In the application mechanism, the magnetic member may be attached to the application needle fixing member, and the electromagnet may be attached to the holder base.

An application apparatus according to one embodiment of the present invention includes the above-described application mechanism.

Advantageous Effects of Invention

An application mechanism and an application apparatus according to one embodiment of the present invention can suppress damage to an application needle tip and a dent in a substrate.

DESCRIPTION OF EMBODIMENTS

Figure 1:
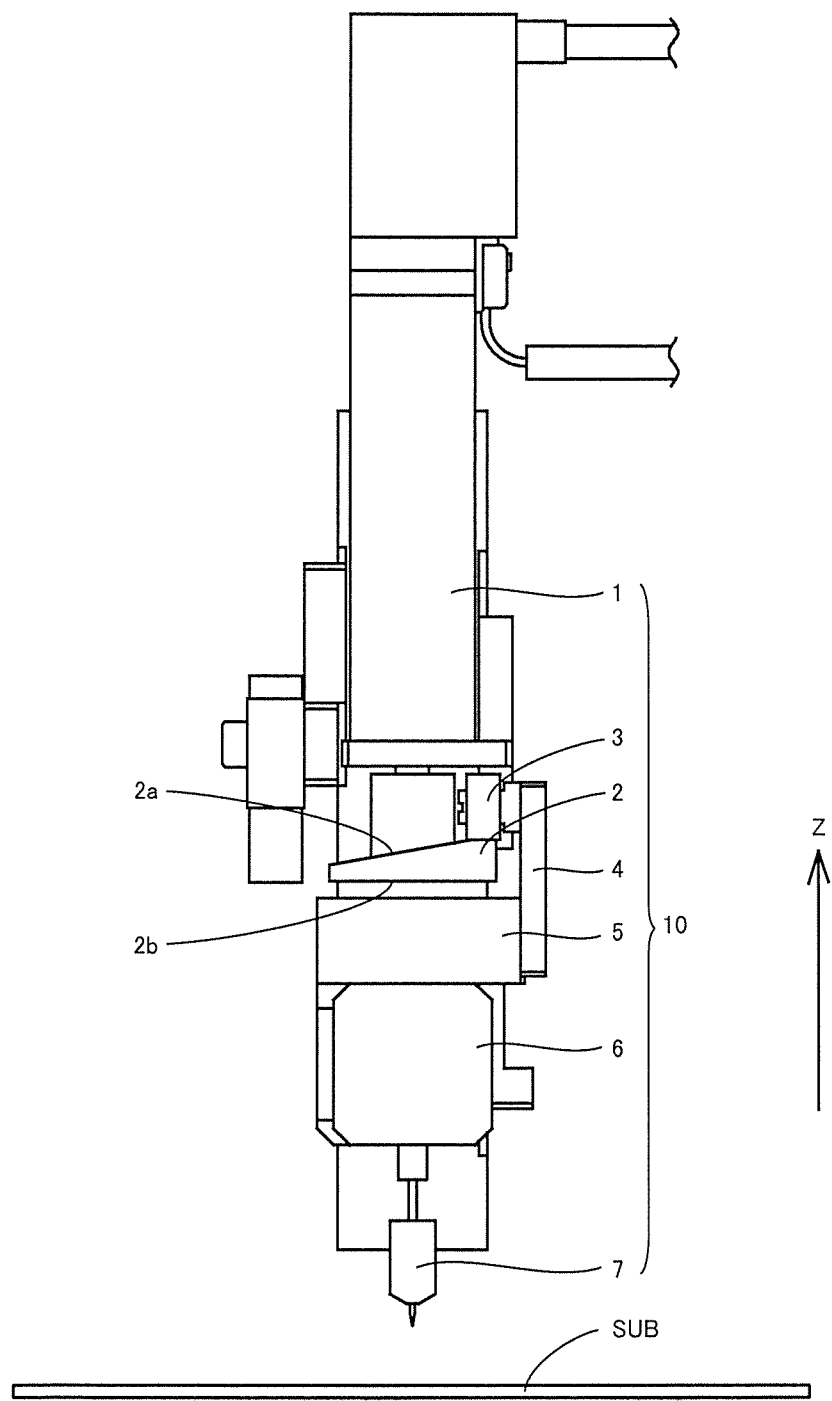
FIG. 1 is a front view of an application mechanism 10 according to an embodiment.

Details of each embodiment will be described with reference to the accompanying drawings, in which the same or corresponding components will be designated by the same reference characters, and the description thereof will not be repeated.

Configuration of Application Mechanism According to Embodiment

The following is an explanation about the configuration of an application mechanism 10 according to an embodiment. FIG. 1 is a front view of application mechanism 10 according to an embodiment. As shown in FIG. 1, application mechanism 10 includes a servo motor 1, a cam 2, a bearing 3, a cam coupling plate 4, a movable portion 5, an application needle holder 6, and an application material container 7. Application mechanism 10 serves as a mechanism for applying an application material onto a substrate SUB. Examples of substrate SUB include a polyethylene terephthalate (PET) film and the like.

Servo motor 1 has a rotational shaft. The rotational shaft of servo motor 1 extends in the Z direction. The rotational shaft of servo motor 1 is rotatable about the central axis.

Cam 2 is attached to the rotational shaft of servo motor 1. Cam 2 is rotatable about the central axis of the rotational shaft of servo motor 1. Cam 2 has a first surface 2a and a second surface 2b. Cam 2 is attached at first surface 2a to the rotational shaft of servo motor 1. Second surface 2b is on the side opposite to first surface 2a. Second surface 2b is orthogonal to the Z direction.

Cam 2 has a center portion and a flange portion. Cam 2 is attached at first surface 2a located in the center portion to the rotational shaft of servo motor 1. The flange portion is disposed on the outer circumference of the center portion. First surface 2a located in the flange portion serves as a cam surface. In other words, the distance between first surface 2a that is located in the flange portion and second surface 2b varies along the circumferential direction of the flange portion.

Bearing 3 is disposed such that its outer circumferential surface is in contact with the cam surface of cam 2 (first surface 2a located in the flange portion). Cam coupling plate 4 has one end and the other end. One end of cam coupling plate 4 is coupled to bearing 3. The other end is on the side opposite to this one end.

Movable portion 5 is coupled to the other end of cam coupling plate 4. Application needle holder 6 is attached to movable portion 5.

Figure 2:
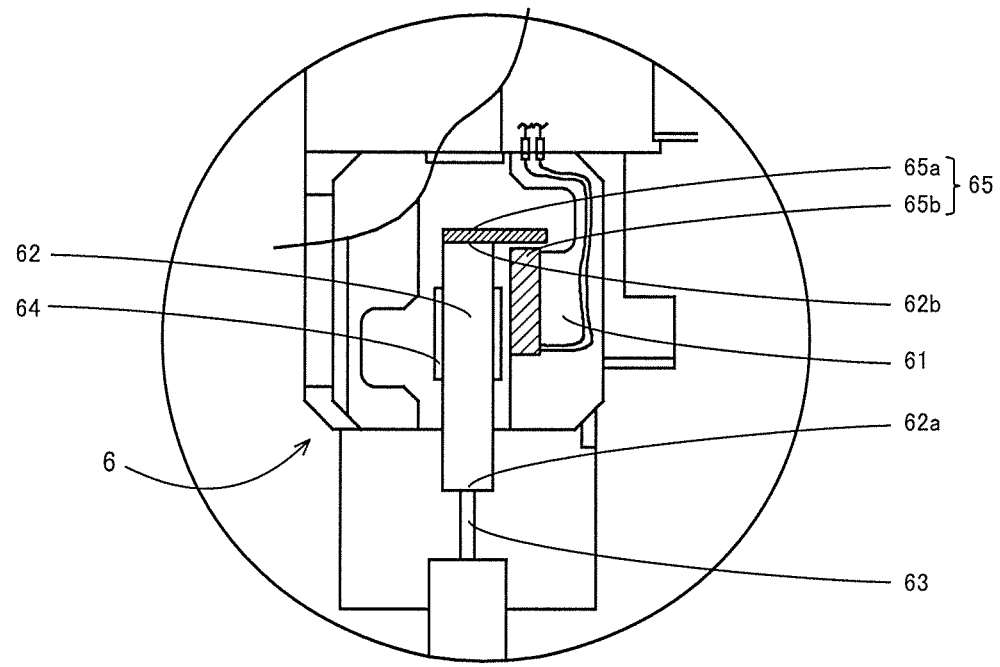
FIG. 2 is an internal structure diagram of an application needle holder 6.

FIG. 2 is an internal structure diagram of application needle holder 6. As shown in FIG. 2, application needle holder 6 includes a holder base 61, an application needle fixing member 62, an application needle 63, a slide mechanism 64, and a position holding mechanism 65.

Application needle fixing member 62, slide mechanism 64, and position holding mechanism 65 are housed inside holder base 61. Application needle fixing member 62 has a first end 62a and a second end 62b. First end 62a and second end 62b are both ends of application needle fixing member 62 in its longitudinal direction. The longitudinal direction of application needle fixing member 62 extends in the Z direction. Application needle 63 is attached to application needle fixing member 62. Specifically, application needle 63 is attached such that its tip side protrudes from first end 62a of application needle fixing member 62. Application needle 63 extends in the Z direction.

Slide mechanism 64 is attached to holder base 61. Application needle fixing member 62 is supported by slide mechanism 64 so as to be slidable in the extending direction of application needle 63 (in the Z direction). In this case, the state where application needle fixing member 62 is supported by slide mechanism 64 so as to be slidable means that there is no exertion of force restricting the sliding motion of application needle fixing member 62 with respect to slide mechanism 64 except for the sliding resistance between application needle fixing member 62 and slide mechanism 64. As slide mechanism 64, a linear guide is used, for example.

Position holding mechanism 65 is constituted of a magnetic member 65a and an electromagnet 65b, for example. Magnetic member 65a is attached to application needle fixing member 62. More specifically, magnetic member 65a is attached to second end 62b of application needle fixing member 62. Magnetic member 65a is made using a magnetic material. Magnetic member 65a may be a permanent magnet. Magnetic member 65a extends in the direction crossing the Z direction. Electromagnet 65b is attached to holder base 61.

Electromagnet 65b is disposed so as to face magnetic member 65a. Electromagnet 65b is configured to generate attraction force for magnetic member 65a by current conduction through electromagnet 65b. As will be described later, current conduction through electromagnet 65b is performed between time $t_A$ and time $t_B$ in FIG. 4, and performed between time $t_C$ and time $t_D$ in FIG. 4, but not performed between time $t_B$ and time $t_C$ in FIG. 4.

Thus, position holding mechanism 65 holds the relative position of application needle fixing member 62 with respect to slide mechanism 64 until immediately before contact of the tip of application needle 63 with substrate SUB, but allows the relative position between application needle fixing member 62 and slide mechanism 64 to change from immediately before contact of the tip of application needle 63 with substrate SUB until separation of the tip of application needle 63 from substrate SUB.

Figure 3:
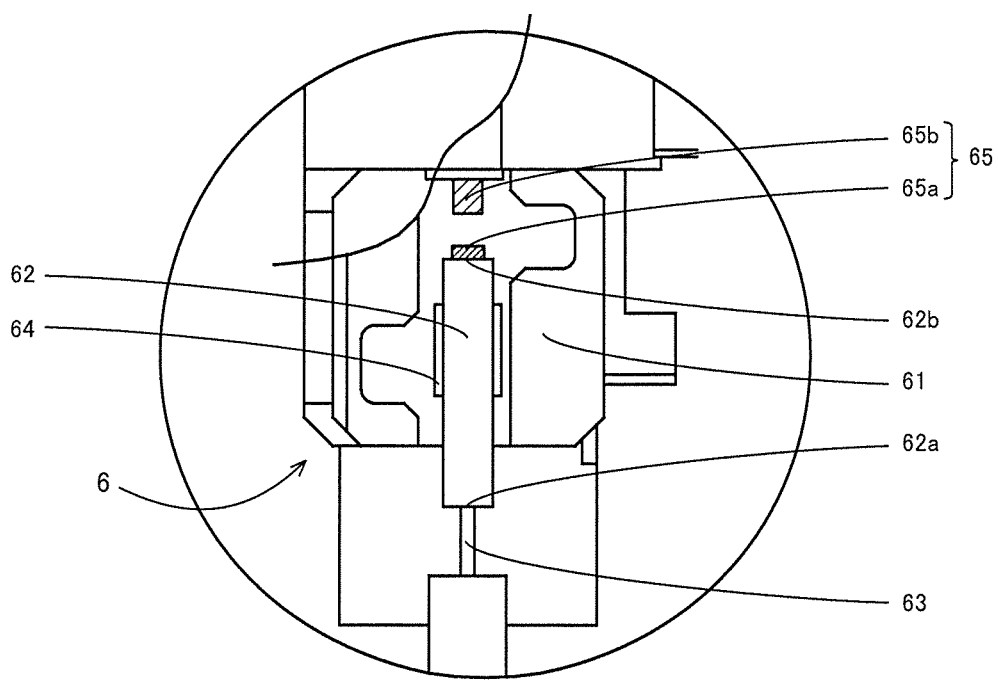
FIG. 3 is an internal structure diagram of a modification of application needle holder 6.

FIG. 3 is an internal structure diagram of a modification of application needle holder 6. As shown in FIG. 3, magnetic member 65a is attached to second end 62b of application needle fixing member 62. Electromagnet 65b is attached to the inner wall surface of holder base 61 that faces second end 62b of application needle fixing member 62. Electromagnet 65b is configured to generate repulsive force for magnetic member 65a by current conduction through electromagnet 65b. Thereby, position holding mechanism 65 may hold the relative position of application needle fixing member 62 with respect to slide mechanism 64.

As shown in FIG. 1, application material container 7 is disposed closer to substrate SUB than application needle holder 6 in the Z direction. Application material container 7 is filled with an application material. Examples of the application material may be a material in a paste state containing electrical conductive particles. Application needle 63 extends through application material container 7 (the tip of application needle 63 protrudes from the bottom surface of application material container 7).

Operation of Application Mechanism According to Embodiment

The following is an explanation about the operation of application mechanism 10 according to an embodiment. The rotational shaft of servo motor 1 rotates about the central axis, to thereby cause cam 2 to rotate about the central axis of the rotational shaft of servo motor 1. The distance between the cam surface (first surface 2a located in the flange portion) and second surface 2b varies along the circumferential direction of the flange portion. Thus, rotation of cam 2 causes a change in position of bearing 3 in the Z direction that is in contact with the cam surface.

Bearing 3 is coupled to movable portion 5 with cam coupling plate 4 interposed therebetween. Application needle holder 6 is attached to movable portion 5. Thus, a change in the position of bearing 3 in the Z direction causes a change in the position of application needle holder 6 in the Z direction.

Figure 4:
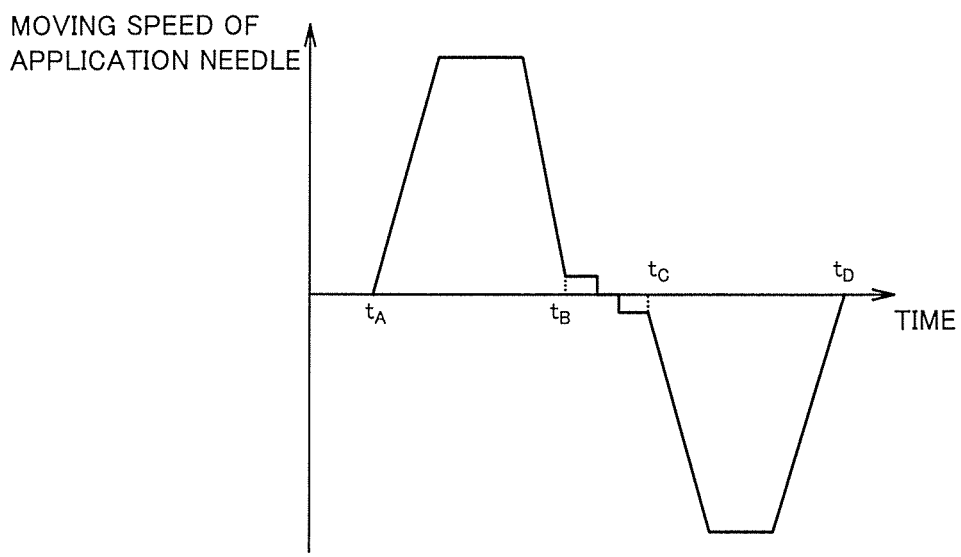
FIG. 4 is a graph showing a profile of a tip position of an application needle 63.

FIG. 4 is a graph showing a profile of a tip position of application needle 63. In FIG. 4, the horizontal axis shows time while the vertical axis shows a moving speed of the tip of application needle 63. As shown in FIG. 4, the tip of application needle 63 is located at the upper end position at time $t_A$. From time $t_A$ to time $t_B$, by current conduction through electromagnet 65b, the relative position of application needle fixing member 62 with respect to slide mechanism 64 is fixed. Thus, from time $t_A$ to time $t_B$, application needle holder 6 (holder base 61) is moved closer to substrate SUB, so that the position of the tip of application needle 63 in the Z direction approaches substrate SUB (the tip of application needle 63 follows the movement of holder base 61). At time $t_B$, the tip of application needle 63 is in the state immediately before it comes into contact with substrate SUB. The distance between the tip of application needle 63 and substrate SUB at time $t_B$ (that is, the distance between the tip of application needle 63 and substrate SUB immediately before contact of the tip of application needle 63 with substrate SUB) is set in advance. It should be noted that the position of the tip of application needle 63 can be controlled as a rotation angle of servo motor 1.

At time $t_B$, current conduction through electromagnet 65b is stopped. As a result, the relative movement of application needle fixing member 62 with respect to slide mechanism 64 is allowed. Then, the tip of application needle 63 comes into contact with substrate SUB due to weights (hereinafter referred to as self-weights) of application needle fixing member 62, application needle 63, and magnetic member 65a. In other words, no force other than self-weights is exerted upon application needle 63 while the tip of application needle 63 is in contact with substrate SUB.

At time $t_C$, current conduction through electromagnet 65b is resumed. From time $t_C$ to time $t_D$, the tip of application needle 63 moves toward the upper end position in the state where the relative position of application needle fixing member 62 with respect to slide mechanism 64 is fixed.

Effect of Application Mechanism According to Embodiment

The following is an explanation about the effect of application mechanism 10 according to an embodiment. As described above, in application mechanism 10, position holding mechanism 65 holds the relative position of application needle fixing member 62 with respect to slide mechanism 64 since a current conducts through electromagnet 65b from time $t_A$ to time $t_B$ in FIG. 4 (until immediately before contact of the tip of application needle 63 with substrate SUB) and from time $t_C$ to time $t_D$ (after separation of the tip of application needle 63 from substrate SUB). On the other hand, position holding mechanism 65 allows the relative position between application needle fixing member 62 and slide mechanism 64 to change since no current conducts through electromagnet 65b from time $t_B$ to time $t_C$ in FIG. 4 (from immediately before contact of the tip of application needle 63 with substrate SUB until separation of the tip of application needle 63 from substrate SUB).

Thus, any variations in positional alignment of application needle holder 6 in the Z direction are absorbed by the relative movement of application needle fixing member 62 with respect to slide mechanism 64. Thus, application mechanism 10 can suppress an increase in contact load between application needle 63 and substrate SUB, so that damage to the tip of application needle 63 and a dent in the substrate can be suppressed.

In the case where the diameter of the tip of application needle 63 is 10 μm or less, the tip of application needle 63 receiving a load exceeding its self-weight may cause damage to substrate SUB, such as peeling off of the application material applied onto substrate SUB from substrate SUB.

In application mechanism 10, the relative position between application needle fixing member 62 and slide mechanism 64 is allowed to change while the tip of application needle 63 is in contact with substrate SUB, as described above. This prevents the tip of application needle 63 from receiving a load exceeding its self-weight. Thus, according to application mechanism 10, damage to substrate SUB can be suppressed, for examples, even in the case where application needle 63 having a tip diameter of 10 μm or less is used.

Configuration of Application Apparatus According to Embodiment

Figure 5:
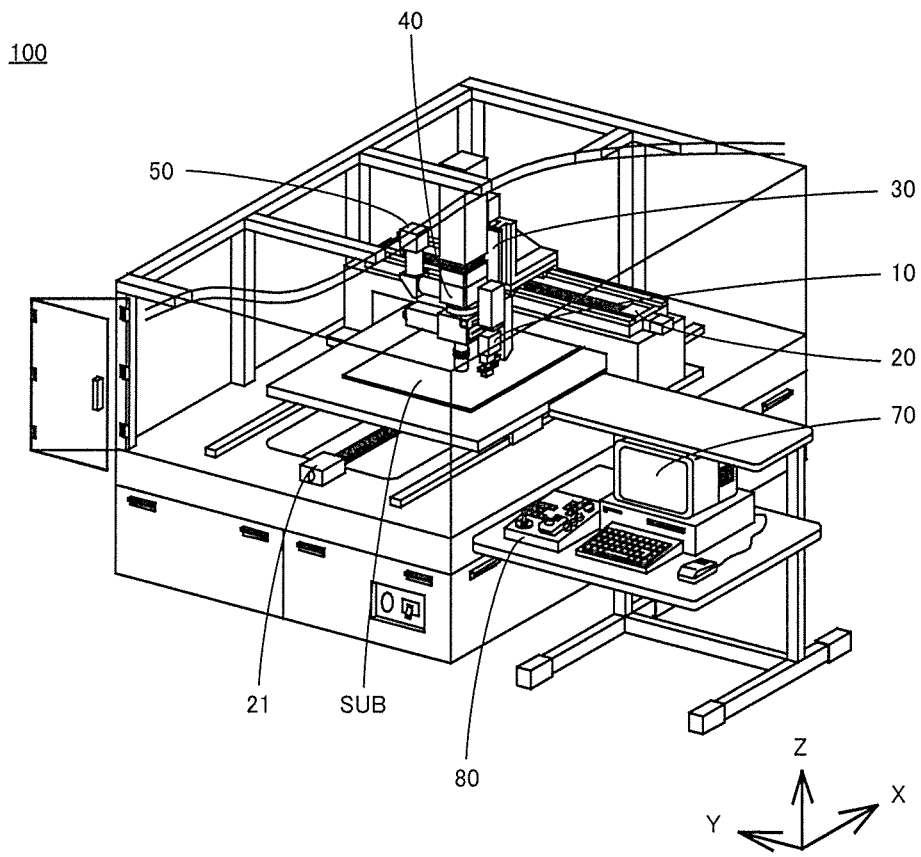
FIG. 5 is a schematic diagram of an application apparatus 100.

The following is an explanation about the configuration of an application apparatus 100 according to the an embodiment. FIG. 5 is a schematic diagram of application apparatus 100. As shown in FIG. 5, application apparatus 100 includes an application mechanism 10, an X-axis table 20, a Y-axis table 21, a Z-axis table 30, an observation optical system 40, a CCD camera 50, a control computer 60, a monitor 70, and an operation panel 80.

Substrate SUB is mounted on X-axis table 20 and Y-axis table 21. X-axis table 20 and Y-axis table 21 can move substrate SUB in the X-axis direction and the Y direction, respectively. Application mechanism 10 is attached to Z-axis table 30 and movable in the Z direction. Observation optical system 40 is used to observe an application position on substrate SUB. CCD camera 50 converts the image on substrate SUB observed by observation optical system 40 into an electrical signal.

Control computer 60 controls application mechanism 10, X-axis table 20, Y-axis table 21, Z-axis table 30, observation optical system 40, and CCD camera 50. Monitor 70 displays the image signal obtained by CCD camera 50 and the image from control computer 60. Operation panel 80 is configured such that a command to the control computer can be input therethrough.

For example, when an application material is applied to form a circuit pattern on substrate SUB, first, X-axis table 20 and Y-axis table 21 are driven to move a region, on which a circuit pattern is to be formed, to directly below observation optical system 40. Thereby, the position at which formation of a circuit pattern is started (hereinafter referred to as a starting position) is checked and determined.

Secondly, application mechanism 10 applies an application material onto substrate SUB to thereby form a circuit pattern. Specifically, X-axis table 20 and Y-axis table 21 are driven to move substrate SUB such that the position onto which an application material is applied (hereinafter referred to as an application position) is located directly below application mechanism 10. Then, an application material is applied onto the application position by application mechanism 10. After completion of this application, X-axis table 20 and Y-axis table 21 are driven to move substrate SUB such that the next application position is located directly below the application mechanism. By continuously repeating such a series of operations, a circuit pattern is formed.

The relation between the lowermost end position of application needle 63 to which application needle 63 is lowered and the focus position of observation optical system 40 is stored in advance. When a circuit pattern is to be formed, the position where the image of observation optical system 40 is focused is used as a reference in the Z-axis direction, and application mechanism 10 is moved by Z-axis table 30 to the position where application needle 63 comes into contact with substrate SUB before the application material is applied as described above.

When a circuit pattern is to be formed on a large area and the position of the surface of substrate SUB in the Z direction is largely changed during formation, the application material is applied while checking the focus position to correct the position of application mechanism 10 in the Z direction during this formation. This checking and adjustment of the focus position may be performed automatically by using image processing, or may be performed in real time while detecting the position of the surface of substrate SUB in the Z direction by a laser sensor and the like.

Although the embodiments of the present invention have been described as above, the above-described embodiments may be variously modified. Furthermore, the scope of the present invention is not limited to the above-described embodiments. The scope of the present invention is defined by the terms of the claims, and is intended to include any modifications within the meaning and scope equivalent to the terms of the claims.

INDUSTRIAL APPLICABILITY

The above-described embodiments are particularly advantageously applicable to an application mechanism and an application apparatus including the application mechanism.

REFERENCE SIGNS LIST 1 servo motor, 2 cam, 2a first surface, 2b second surface, 3 bearing, 4 cam coupling plate, 5 movable portion, 6 application needle holder, 61 holder base, 62 application needle fixing member, 62a first end, 62b second end, 63 application needle, 64 slide mechanism, 65 position holding mechanism, 65a magnetic member, 65b electromagnet, 7 application material container, 10 application mechanism, 20 X-axis table, 21 Y-axis table, 30 Z-axis table, 40 observation optical system, 50 camera, 60 control computer, 70 monitor, 80 operation panel, 100 application apparatus, SUB substrate.

The invention claimed is:

1. An application mechanism that applies an application material onto a substrate using an application needle, the application mechanism comprising:
   a holder base;
   a slide mechanism attached to an inside of the holder base;
   an application needle fixing member, to which the application needle is attached, the application needle fixing member being supported by the slide mechanism so as to be slidable in an extending direction of the application needle;
   a position holding mechanism that holds a relative position of the application needle fixing member with respect to the slide mechanism;

an observation optical system configured to observe an application position on the substrate; and an application material container that contains an application material, wherein the position holding mechanism holds the relative position of the application needle fixing member with respect to the slide mechanism until immediately before contact of a tip of the application needle with the substrate, the position holding mechanism allows the relative position of the application needle fixing member with respect to the slide mechanism to change from immediately before contact of the tip of the application needle with the substrate until separation of the tip of the application needle from the substrate, the observation optical system configured such that a position where an image of the observation optical system is focused is used as a reference position, and the application mechanism is moved to a position where the application needle comes into contact with the substrate, and a focus position is adjusted according to a surface position of the substrate, and the tip of the application needle protrudes from a bottom surface of the application material container while the position holding mechanism holds the relative position of the application needle fixing member with respect to the slide mechanism.

2. The application mechanism according to claim 1, wherein
the position holding mechanism is constituted of
a magnetic member, and
an electromagnet that is disposed to face the magnetic member.

3. The application mechanism according to claim 2, wherein the magnetic member is a permanent magnet.

4. The application mechanism according to claim 2, wherein
the magnetic member is attached to the application needle fixing member, and
the electromagnet is attached to the holder base.

5. An application apparatus comprising:
the application mechanism according to claim 1; and
an X-Y stage for holding the substrate.

* * * * *